(12) United States Patent
Johnson et al.

(10) Patent No.: US 7,009,224 B2
(45) Date of Patent: Mar. 7, 2006

(54) METAMORPHIC LONG WAVELENGTH HIGH-SPEED PHOTODIODE

(75) Inventors: Ralph H. Johnson, Murphy, TX (US); James K. Guenter, Garland, TX (US); James R. Biard, Richardson, TX (US)

(73) Assignee: Finisar Corporation, Sunnyvale, CA (US)

(*) Notice: Subject to any disclaimer, the term of this patent is extended or adjusted under 35 U.S.C. 154(b) by 182 days.

(21) Appl. No.: 10/413,186

(22) Filed: Apr. 14, 2003

(65) Prior Publication Data

US 2003/0215971 A1 Nov. 20, 2003

Related U.S. Application Data

(62) Division of application No. 09/766,797, filed on Jan. 22, 2001, now Pat. No. 6,558,973.

(51) Int. Cl.
*H01L 31/0336* (2006.01)
*H01L 31/0328* (2006.01)

(52) U.S. Cl. .......................... 257/190; 257/191; 257/18; 257/28; 438/37

(58) Field of Classification Search ................. 257/190, 257/191, 18, 28, 200; 438/37
See application file for complete search history.

(56) References Cited

U.S. PATENT DOCUMENTS

| | | |
|---|---|---|
| 3,936,856 A | 2/1976 | Magdo |
| 4,558,336 A | 12/1985 | Chang et al. |
| 4,607,272 A | 8/1986 | Osbourn |
| 4,695,857 A | 9/1987 | Baba et al. |
| 5,148,267 A | 9/1992 | Ty Tan et al. |
| 5,204,284 A | 4/1993 | Kuo et al. |
| 5,770,868 A | 6/1998 | Gill et al. |
| 5,877,519 A * | 3/1999 | Jewell .................. 257/190 |
| 5,952,701 A | 9/1999 | Bulucea et al. |
| 5,969,385 A | 10/1999 | Nathanson |
| 6,046,065 A | 4/2000 | Goldstein et al. |
| 6,320,212 B1 * | 11/2001 | Chow .................. 257/197 |

FOREIGN PATENT DOCUMENTS

| | | |
|---|---|---|
| DE | 195 15 667 A1 | 10/1996 |
| EP | 0 296 428 A2 | 12/1988 |
| EP | 0 358 322 A2 | 3/1990 |
| FR | 2 768 556 A1 | 3/1999 |
| WO | WO 00/48239 A1 | 8/2000 |
| WO | WO 00/58999 A2 | 10/2000 |

OTHER PUBLICATIONS

Chertouk, M., et al., "Metamorphic InAlAs/InGaAs HEMT on GaAs substrates with a novel composite channels design", article, IEEE Electronic Device Letters, vol. 17, No. 6, Jun. 1996, pp. 273–275.

International Search Report, dated Mar. 28, 2003, relative to PCT application No. PCT/US 02/01969, the foreign equivalent to the instant U.S. Appl. No. 09/766,797.

* cited by examiner

Primary Examiner—Amir Zarabian
Assistant Examiner—Kiesha Rose
(74) Attorney, Agent, or Firm—Workman Nydegger

(57) ABSTRACT

A metamorphic device including a substrate structure upon which a semiconductor device can be formed. In the metamorphic device, a buffer layer matching a substrate lattice constant is formed at normal growth temperatures and a thin grading layer which grades past the desired lattice constant is configured at a low temperature. A reverse grading layer grades the lattice constant back to match a desired lattice constant. Thereafter, a thick layer is formed thereon, based on the desired lattice constant. Annealing can then occur to isolate dislocated material in at least the grading layer and the reverse grading layer. Thereon a strained layer superlattice is created upon which a high-speed photodiode or other semiconductor device can be formed.

27 Claims, 7 Drawing Sheets

FIG. 7

```
320 ──┐
394 ── 50 nm 1.3e18 p, x=0, y=.42                                    ┐
392 ── 20 nm, 1e18 p, x=0.05, y=0.42,                                ├ CAP
390 ── RAMP FROM x=0.8 TO 0.05, y=0.42, 100 nm p 3.4e18 TO 1e18      ┘
388 ── x=0.8 WINDOW AND CONDUCTION LAYER, p=3.4e18, y=0.42, 2000 nm
386 ── 100 nm RAMP x=0.05 TO .8 DOPING 1.4e17 p TO 3.4e18 p, y=0.42
384 ── x=0 y=0.42 LINEAR DOPING GRADE FROM 2e16 p TO 7e16 p, 500 nm  ┐
382 ── ACTIVE REGION, LINEAR DOPING GRADE FROM <5e15 n TO ABOUT      ├ ACTIVE
       2e16 p, y=0.42, x=0, 500 nm                                   │ REGION
380 ── ACTIVE REGION, n-TYPE WITH p-TYPE COUNTER DOPING, SO IT IS    │
       < 5e15 n-TYPE, 2000 nm, x=0, y=0.42                           ┘
378 ── RAMP x=0.05 TO 0.025, y=.42, 3e17, 3 nm
376 ── RAMP x=0.075 TO 0.05, y=0.42, UNDOPED 10 nm
374 ── RAMP x=0.1 TO 0.075, y=0.42, 3e17 n, 3 nm
372 ── RAMP x=0.125 TO 0.1, y=.42, UNDOPED, 10 nm                    ┐ DEBYE
370 ── RAMP x=0.15 TO 0.125, y=.42, 3e17 n, 3 nm                     ├ LENGTH
368 ── RAMP x=.175 TO 0.15, y=.42, UNDOPED 10 nm                     │ DOPING IN
366 ── RAMP x=0.2 TO 0.175, y=.42, 3e17 n, 3 nm                      │ RAMP
364 ── RAMP x=0.225 TO 0.2, y=0.42 UNDOPED, 10 nm                    ┘
362 ── RAMP x=.25 TO 0.225, y=0.42, 3e17 n, 3 nm                     ┐ 80 PERIODS
360 ── x=0.25, y=0.42, UNDOPED, 10 nm                                ├ DEBYE
358 ── x=0.25, y=0.42, 3e17 n-TYPE, 4 nm                             ┘ LENGTH
356 ── 50 nm x=0.25, y=0.42, 5e17 n-TYPE                               DOPING
354 ── 50 nm, x RAMP FROM x=0 TO x=.25, y=.42, 5e17 n-TYPE
```

| | | |
|---|---|---|
| 5e17 n-TYPE | y=0.42, 100 nm 5e17 n-TYPE | ~ 352 |
| 100 PERIODS | STRAINED LAYER y=0.37, THICKNESS=6 nm | ~ 350 |
| | STRAINED LAYER y=0.47 THICKNESS=6 nm | ~ 348 |
| 100 PERIODS | STRAINED LAYER y=0.39 THICKNESS=6 nm | ~ 346 |
| | STRAINED LAYER y=0.45 THICKNESS=6 nm | ~ 344 |
| 100 PERIODS | STRAINED LAYER y=0.40 THICKNESS 6 nm | ~ 342 |
| | STRAINED LAYER y=.44 THICK=6 nm | ~ 340 |
| | 640 C 0.2 MICRON y=0.42 | ~ 338 |
| | THICKNESS=0, ANNEAL RAMP TO 750 C, 5 MIN HOLD AT 750 C RAMP TO 640 C | ~ 336 |
| | 500 nm y=.42 HIGH V/III, 640 C 5e17 n | ~ 334 |
| | 200 nm x=.42 TEMP RAMP UP TO 640 C 2.5e18 | ~ 332 |

```
330 ── 10 nm RAMP FROM y=.52 TO .42 2.5e18 n
328 ── 10 nm y=0.52 nm 2.5e18
326 ── COMPOSITION RAMP FROM y=0.0345 TO y=0.52 THICK=10 nm
       2.5e18 n
324 ── 0.1 MICRON BUFFER 1e18 n
322 ── SUBSTRATE
```

METAMORPHIC LONG WAVELENGTH HIGH-SPEED PHOTODIODE

This application is a divisional application of application Ser. No. 09/766,797, filed on Jan. 22, 2001 now U.S. Pat. No. 6,558,973.

BACKGROUND OF THE INVENTION

The present invention relates to semiconductor devices and methods for manufacturing the same. The present invention also relates to photodiode devices and methods for manufacturing the same. The present invention additionally relates to high-speed, long-wavelength photodiode devices and improved methods for manufacturing the same. The present invention further relates to techniques for growing semiconductor photodiode devices on substrates.

With the rapid development of lightwave communications, low-cost, high-performance optical photodiodes are required for a variety of system applications. Photodiodes are p-n junction semiconductor devices that produce a significant photocurrent when illuminated. Photodiodes operate based on principals of photoconductivity, which is an enhancement of the conductivity of p-n semiconductor junctions due to the absorption of electromagnetic radiation. Photoconductivity may result from the action of radiation in the visible portion of the spectrum in some materials.

There are two main classes of photodiodes currently in use today. These are depletion-layer diodes and avalanche diodes. Depletion-layer photodiodes are based on a reverse-biased p-n junction configuration operated below a particular breakdown voltage. When exposed to electromagnetic radiation of a desired wavelength, excess charge carriers may be produced as a result of absorption. Such carriers may be formed as electron-hole pairs. Those electron-hole pairs generated in or near to a depletion layer at a junction, cross the junction and produce a photocurrent. Avalanche diodes are based on reverse-biased p-n junction diodes operated at voltages above the breakdown voltage. Current multiplication of electron-hole pairs, generated by incident electromagnetic radiation, occurs due to the "avalanche process," well known in the photodiode arts.

Semiconductor photodiodes can be constructed from any semiconductor and are typically constructed from single crystal silicon wafers similar to those utilized in the manufacture of integrated circuits. Long-wavelength (e.g., 1310 nm and 1550 nm) photodiodes are typically made from InGaAs with nominally the same lattice constant as Indium Phosphide (InP).

Currently, long-wavelength (about 1200 nm–1650 nm), high-speed photodiodes are all grown on Indium Phosphide (InP) substrates. The integration of receiver photodiode components operating in the long-wavelength range necessitates the utilization of Indium Gallium Arsenide (InGaAs) p-i-n photodetectors and, hence, a technology based on InP substrates in order to avoid strained layers, which cause misfit dislocations due to the lattice mismatch. Unlike Silicon (Si) and Gallium Arsenide (GaAs), however, InP is not as well established and is very fragile. In addition, InP substrates are expensive and not available in sizes as large as GaAs or Si. Finally, gas phase epitaxial growth on InP requires the use of phosphine, which is often not available on particular epitaxial systems and causes several technical problems.

FIG. 1 depicts a cross-sectional view of a prior art monolithic integrated photoreceiver to illustrate prior art photodiode fabrication techniques. As shown in FIG. 1, a photoreceiver 100 may detect and amplify optical beam 50, which impinges on p-i-n photodiode 23 at a wavelength $\lambda_s$ which can be chosen to be greater than 1.0 $\mu m$ because, among other reasons, the InP semiconductor may be transparent for those wavelengths. Such an integrated photoreceiver may afford materials compatibility and separate optimization control over the photonics and electronics functions because each device is electrically isolated as well as physically separated from the others. It is important to note, however, that despite materials compatibility and separate optimization control, such a device is relatively expensive, fragile, and difficult to process, requiring complicated integration into components. It should be noted that the semiconductor layers underlying the HBT, while structurally adapted for forming a photodiode, are not electrically or optically active.

In the prior art photoreceiver structure illustrated in FIG. 1, the photodiode and heterostructure bipolar transistor have semiconductor layers selected from the InP/InGaAs material system and grown over a non-patterned Fe doped InP substrate.

Standard fabrication techniques, including metalorganic vapor phase epitaxy (MOVPE), selective wet chemical etching, reactive ion etching and contact metallization, may be utilized to fabricate the prior art illustrated in FIG. 1. These fabrication techniques are well known to those persons of ordinary skill in the art and, thus, are not discussed in detail here.

The prior art device illustrated in FIG. 1 may be epitaxially grown on a planar Fe doped <001> oriented InP substrate 10. The p-i-n epilayers comprise a 4000 Å thick InP layer 20, a 1.0 $\mu m$ thick InGaAs layer 21, and a 4000 Å thick InP layer 22, which may be grown on semi-insulating substrate 10 by MOVPE. Semiconductor layers 20, 21, and 22 thus may form p-i-n photodiode 23.

The epitaxial layers of heterostructure bipolar transistor (HBT) 24 can be grown over the entire structure, such that no intervening processing exists between the deposition of each epilayer. That is, the growth run may be continuous and uninterrupted. HBT 24 may comprise a sub-collector layer 25, collector layer 26, base layer 27, emitter layer 28, and an emitter cap layer 29. It should be noted that HBT 24 may be configured as a single heterostructure device, while photodetector 23 may possess a photoabsorbing layer 21.

After the growth of the photodiode and heterostructure bipolar transistor epitaxial layers, wet chemical etching can be performed to realize the mesa structures thereof. In association with the wet chemical etch, photoresist patterning can be oriented 45 degrees to the [001] and [001] crystallographic direction planes in order to maintain the geometrical shape of the mesa structure. Alternatively stated, the line features of the devices, that is, photodiode 23 and HBT 24, can be delineated so that they are 45 degrees to the [001] and [001] direction planes.

Conventional ohmic contacts, such as AuGe/Au and AuZn/Au, may be deposited on the lateral edges of the mesa in order to provide ohmic contacts 31, 32, 33, and 34 to layer 20, subcollector layer 25, base layer 27, and emitter cap layer 29, respectively. It should be noted that standard metallic deposition techniques can be employed in fabricating the ohmic contact. Additionally, for photodetector 23, an annular alloyed ohmic contact 30 may provide contact to layer 22. Annular ohmic contact 30 may be formed by standard photolithographic, including evaporation and lift-off techniques well known in the art.

To reflect any unabsorbed optical beam 50 back into photoabsorbing region 21 and, thus, increase the quantum efficiency, a non-alloyed Cr/Au metal contact 36 can be deposited in the annular opening of contact 30. After planarization and passivation, such as by using a spun-on polyimide 35, reactive ion etching of the polyimide in an oxygen plasma may be employed to open windows therein in order to facilitate attaching leads, not shown, to the ohmic contacts. After fabrication, substrate 10 may be thinned and polished in order to permit backside illumination.

Based on the foregoing, those skilled in the art can appreciate that prior art manufacturing methods for semiconductor devices, such as photodiodes grown on InP substrates, are expensive, fragile, difficult to process, and additionally difficult to build into components. Such processing complexity also results in inefficiencies and increased manufacturing expenses. In view of reducing the processing complexity, it is, therefore desirable to develop an alternative technique for forming high-speed photodiodes and devices based on high-speed photodiodes, such as photoreceivers. The present inventors have developed a technique and devices thereof, disclosed herein, which overcome the inefficiencies inherent in the manufacturing of prior art semiconductor devices.

BRIEF SUMMARY OF THE INVENTION

The following summary of the invention is provided to facilitate an understanding of some of the innovative features unique to the present invention and is not intended to be a full description. A full appreciation of the various aspects of the invention can be gained by taking the entire specification, claims, drawings, and abstract as a whole.

It is an aspect of the present invention to provide a high-speed photodiode grown on a substrate.

It is another aspect of the present invention to provide methods for growing a high-speed photodiode on a substrate.

It is yet another aspect of the present invention to provide a long wavelength photodiode grown on GaAs.

It is still another aspect of the present invention to provide a metamorphic long-wavelength, high-speed photodiode formed utilizing a superlattice containing substrate and metamorphic epitaxial growth techniques.

The above and other aspects are achieved as is now described. A method and apparatus for fabricating a metamorphic long-wavelength, high-speed photodiode is thus disclosed, wherein a buffer layer matching the substrate lattice constant can be formed at normal growth temperatures and a thin graded region which grades past the desired lattice constant is configured at a low temperature. Upon this graded region, a thin layer can be configured again at low temperatures whose lattice constant is the end lattice constant of the grade and is past the desired lattice constant.

A reverse grade back can then be performed to match the desired lattice constant. Thereafter, a thick layer is formed thereon, based on the desired lattice constant. Annealing can then occur to isolate dislocated material in the graded layer, the reverse graded layer and the layer therebetween. A strained layer superlattice can be then formed thereon, on which a high-speed photodiode can be formed. The strained layer superlattice further isolates the photodiode from the misfit dislocations caused by the metamorphic transition. Note that the terms "graded layer" and "grading layer" are generally synonymous and may be utilized herein interchangeably.

Upon the strained layer superlattice, the photodiode structure can be created. Implant or diffusion layers can be formed based on materials, such as Be, Mg, C, Si, Se, Te, S or Zn. A metal layer can be formed over a cap etch above a P+ region situated directly over an N- active region. The high-speed photodiode can thus be formed on GaAs, which is much cheaper, less fragile and readily configurable into components. Formation of the photodiode can be accomplished utilizing MOCVD as the epitaxial growth technique, although those skilled in the art can appreciate that other growth techniques, such as MBE, can also be utilized in accordance with the methods and apparatus described herein. The preferred substrate orientation is (100) nominally on orientation. Those skilled in the art will appreciate that the term (100) as utilized herein can be expressed as (100), <100>, or [100] or pronounced phonetically as "1-0-0" and not to be confused with the reference numeral 100 utilized with regard to FIG. 1.

BRIEF DESCRIPTION OF THE DRAWINGS

The accompanying figures, in which like reference numerals refer to identical or functionally-similar elements throughout the separate views and which are incorporated in and form part of the specification, further illustrate the present invention and, together with the detailed description of the invention, serve to explain the principles of the present invention.

FIG. 7 depicts a structural diagram illustrating the epitaxial process for forming a high-speed photodiode, in accordance with preferred embodiments of the present invention.

DETAILED DESCRIPTION OF THE INVENTION

The particular values and configurations discussed in these non-limiting examples can be varied and are cited merely to illustrate an embodiment of the present invention and are not intended to limit the scope of the invention.

Figure 1:
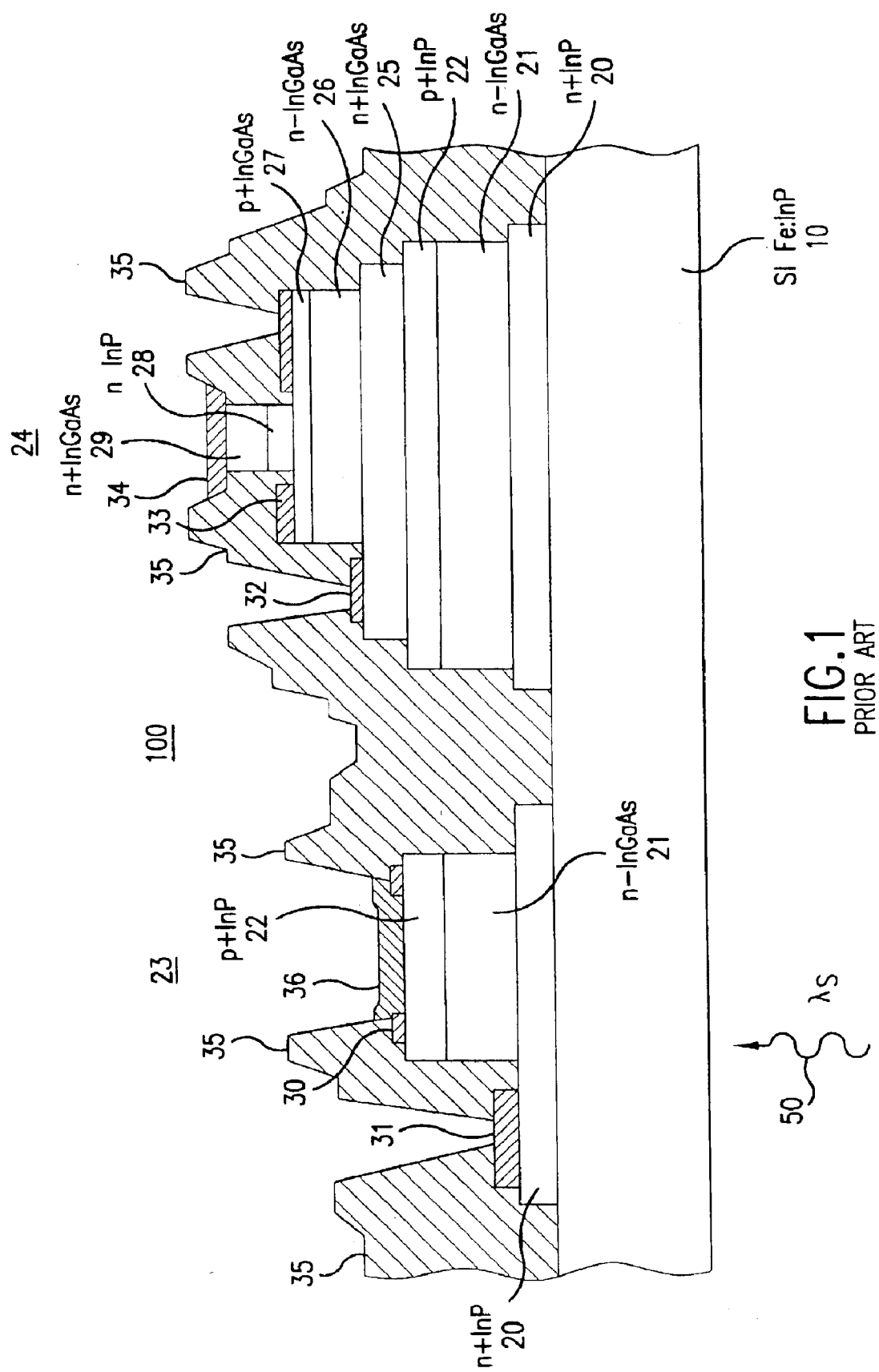
FIG. 1 depicts a cross-sectional view of a prior art monolithic integrated photoreceiver to illustrate prior art photodiode fabrication techniques.
Figure 2:
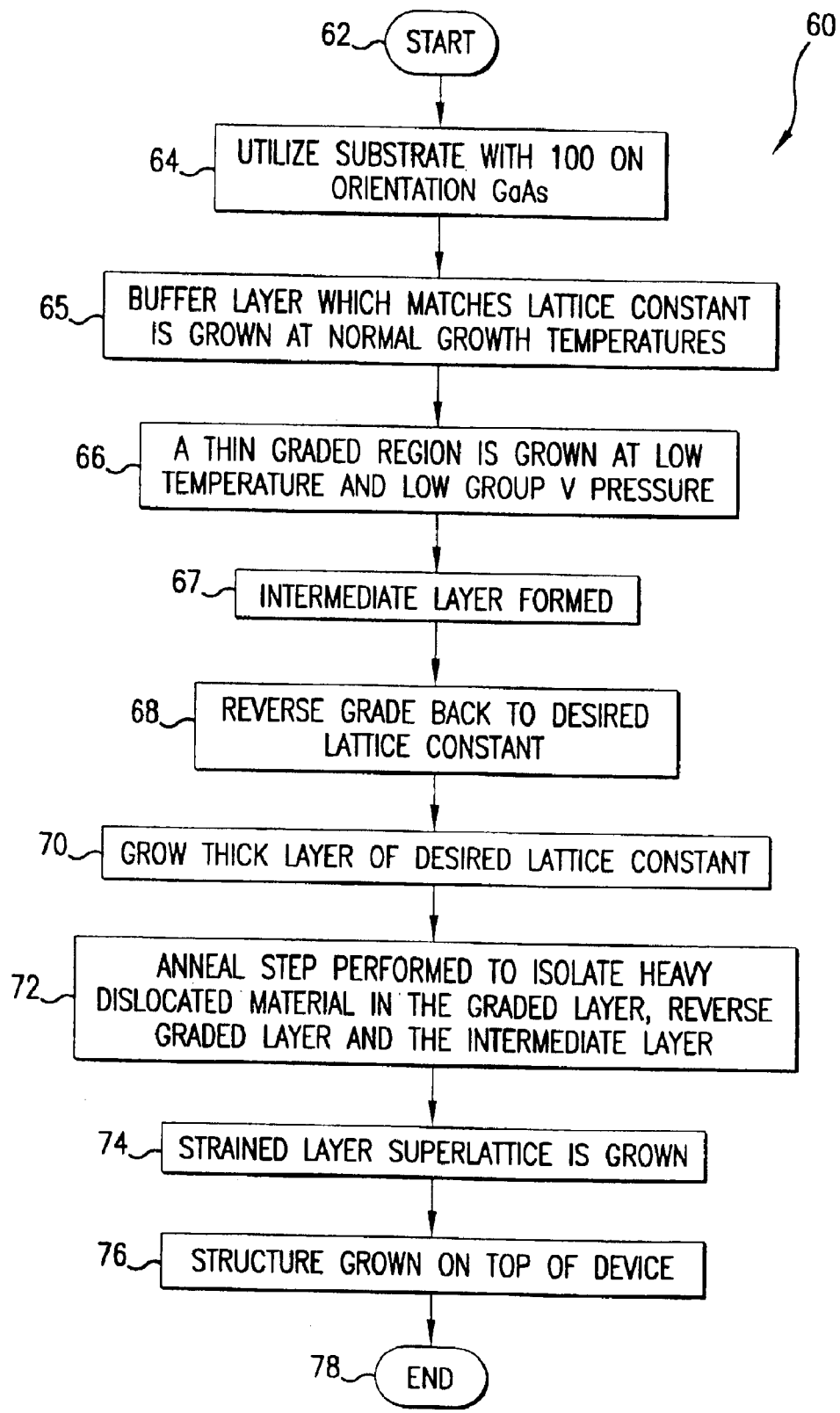
FIG. 2 is a flow chart illustrating operational steps for fabricating a semiconductor device in accordance with preferred embodiments of the present invention.

FIG. 2 is a flow chart illustrating operational steps for fabricating a semiconductor device in accordance with preferred embodiments of the present invention. A photodiode is one type of semiconductor device that can be fabricated according to the steps and processes disclosed herein. Thus, a photodiode device can be constructed according to the operations illustrated in FIG. 2. Using grading, an intermediate layer, an inverse grade, (100) nominally on orientation GaAs substrates, in-situ annealing, and a strained layer superlattice, artificial substrates can be created on which semiconductor devices, such as long-wavelength photodiodes, are fabricated.

The strained layer superlattice can be composed of a lower strain, a medium strain, and a high strain, such that none of the individual layers are so thick so as to produce dislocations, but approach this thickness in the high-strain region. The photodiodes grown according to the method described herein may be referred to as "long wavelength" photodiodes because they can be designed to operate in a broad range of wavelengths. In a preferred embodiment the range of wavelengths is in the nominally 1550 nanometer and 1310 nanometer wavelength range which are commonly used in communications.

Using heavy n-type doping through the grading regions and InGaAs as the grading material, conduction through the heavily dislocated grading region can be maintained. Those skilled in the art will appreciate that "doping" involves the addition of a particular type of impurity in order to achieve a desired n-conductivity or p-conductivity (i.e., in the case of p-type doping). The donor impurities are added to form an n-type semiconductor. Acceptor impurities typically form p-type semiconductors.

By utilizing relatively thin grades, and (100) orientation substrates, the surface morphology will provide for adequate device processing. Processing can be achieved utilizing MOCVD as the epitaxial growth technique. Those skilled in the art can appreciate that other growth techniques can also be utilized in accordance with the present invention, including MBE, which is well known in the art.

Thus, as indicated in FIG. 2 at block 62, the process is initiated. To configure a photodiode device according to the method described herein, a substrate, which is (100) on orientation GaAs can be utilized, as illustrated at block 64. Preferably, GaAs is utilized as the substrate material because it is less fragile and less expensive than other substrate materials. In addition, the use of GaAs does not require a phosphorous source. Those skilled in the art can appreciate, however, that other substrates can be utilized in accordance with the present invention, including substrates such as germanium or silicon.

A buffer layer which matches the lattice constant can be grown first at normal growth temperatures, as depicted at block 65. Thereafter, as described at block 66, a thin grading region which grades past the desired lattice constant can be grown at a low temperature and a low group V pressure. Next, a thin intermediate layer of the lattice constant, which is at the end point composition of the grading layer, is grown, as depicted at block 67. The intermediate layer is formed, such that the intermediate layer comprises a lattice constant slightly greater than a desired lattice constant.

Next, as illustrated at block 68, a reverse grade back to the desired lattice constant can be performed. Grading in this manner is useful to prevent three-dimensional growth and to isolate dislocations to these layers. If a step is used instead of a grade, island growth in three dimensions occurs, which degrades the material quality.

Thereafter, as depicted at block 70, beginning at a low temperature and ramping the temperature up, a thick (approximately 0.5 micron) layer of the desired lattice constant can be formed.

An anneal step can then be performed, as indicated at block 72, which tends to isolate the heavily dislocated material in the graded, reverse graded and constant composition layer therebetween. Then, as depicted at block 74, a strained layer superlattice can be grown with individual thickness approaching a critical thickness, but not exceeding such a thickness. This will tend to exclude dislocation loops and further improves the quality of the subsequently grown material.

Finally, as illustrated at block 76, the device structure can be grown on top of these layers. The device structure for the photodetector (i.e., photodiode) can be a buffer layer followed by a ramp in Al composition to the lower confining layer. The lower confining layer prevents a slow tail response. On the lower confining layer, another layer with an Al ramp down layer can be grown to grade to the active region composition. Grades can be utilized to ensure good electrical conduction in the device. These ramps are grades of the aluminum-to-gallium ratio and cause a change in energy band gap without an intentional change in lattice constant.

The active region can be nominally 3 microns thick and doped n-type at less than 5e15 in the lower portion and can have a p-type upper portion of nominally 1 micron thick. It is important that the active region be configured at least partially as an n-type active region for speed and that, additionally, the n portion of the active region have less than a value of 5e15 n-doping for capacitance. In this material, the background doping can be nominally n-type, or there can be an n-diffusion tail from lower layers so counter doping can be used to reduce the effective doping to less than 5e15 using carbon because of its low doping efficiency.

Figure 3:
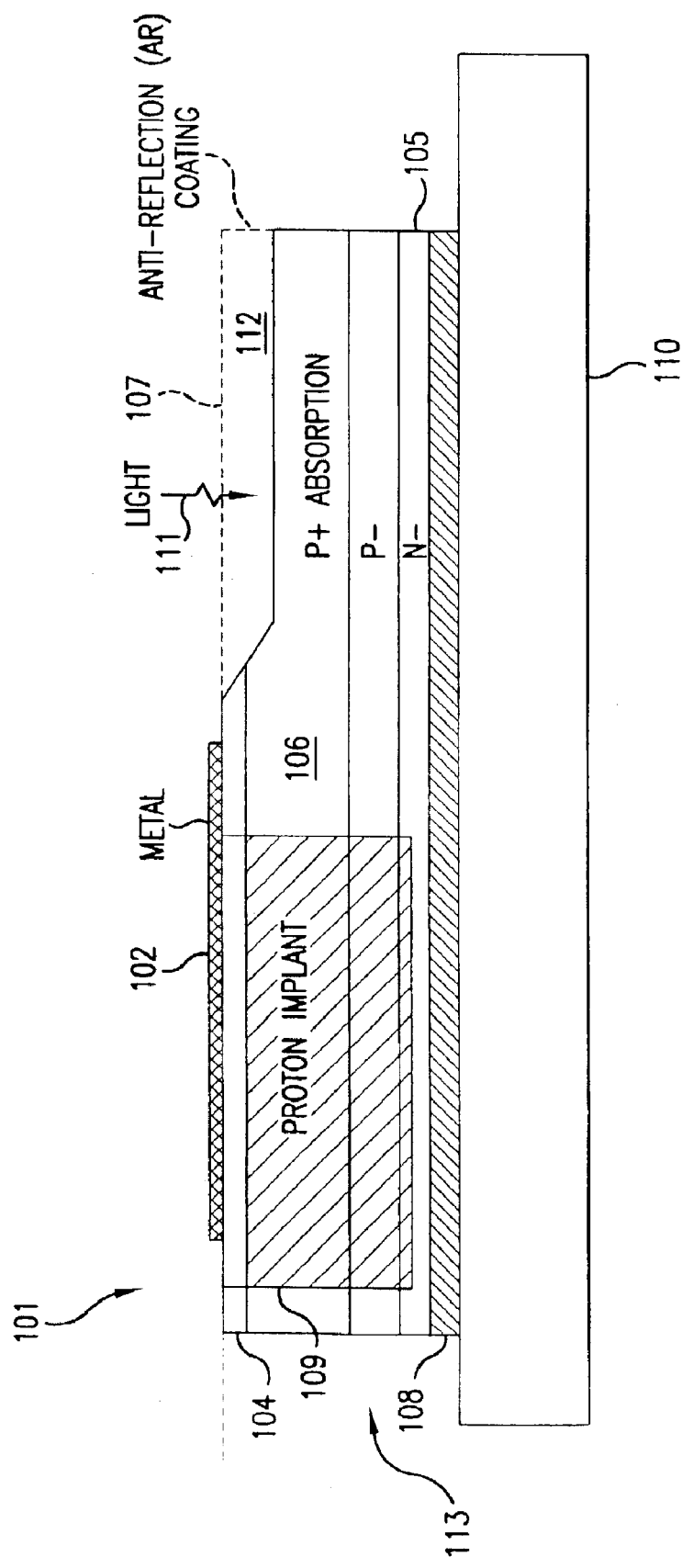
FIG. 3 depicts a block diagram illustrating an epitaxial structure for a photodiode device, in accordance with preferred embodiments of the present invention.

FIG. 3 depicts a block diagram 101 illustrating a structure for a photodiode device, in accordance with preferred embodiments of the present invention. In the block diagram illustrated in FIG. 3, metamorphic layers 110 can be grown to create a substrate structure upon which a semiconductor photodiode device can be configured. A lower confining layer 108 can be superimposed upon metamorphic layers 110. An active layer 105 can be grown above lower confining layer 108. A conduction layer 106 can be situated below cap 104 and a metal layer 102. Region 109 represents a proton implant. A portion of the cap 104 and conduction layer 106 is etched to allow transmission of light to the active region.

The antireflection (AR) coating 112 is indicated in FIG. 3 bordered by dashed lines above conduction layer 106. AR coating 112 can be composed of Silicon Nitride or other material as will become apparent to those skilled in the art. Light 111 is indicated by an arrow and is incident on antireflection (AR) coating 112. Absorption of light 111 occurs through conduction layer 106 and active layer 105. Trench 113 can be based on a trench etch, along with a proton implant to provide isolation and to reduce capacitance. Trench 113 should extend into lower confining layer 108. Those skilled in the art can appreciate that there are a number of possible variations that can be utilized to process a photodiode according to the methods described herein.

Figure 4:
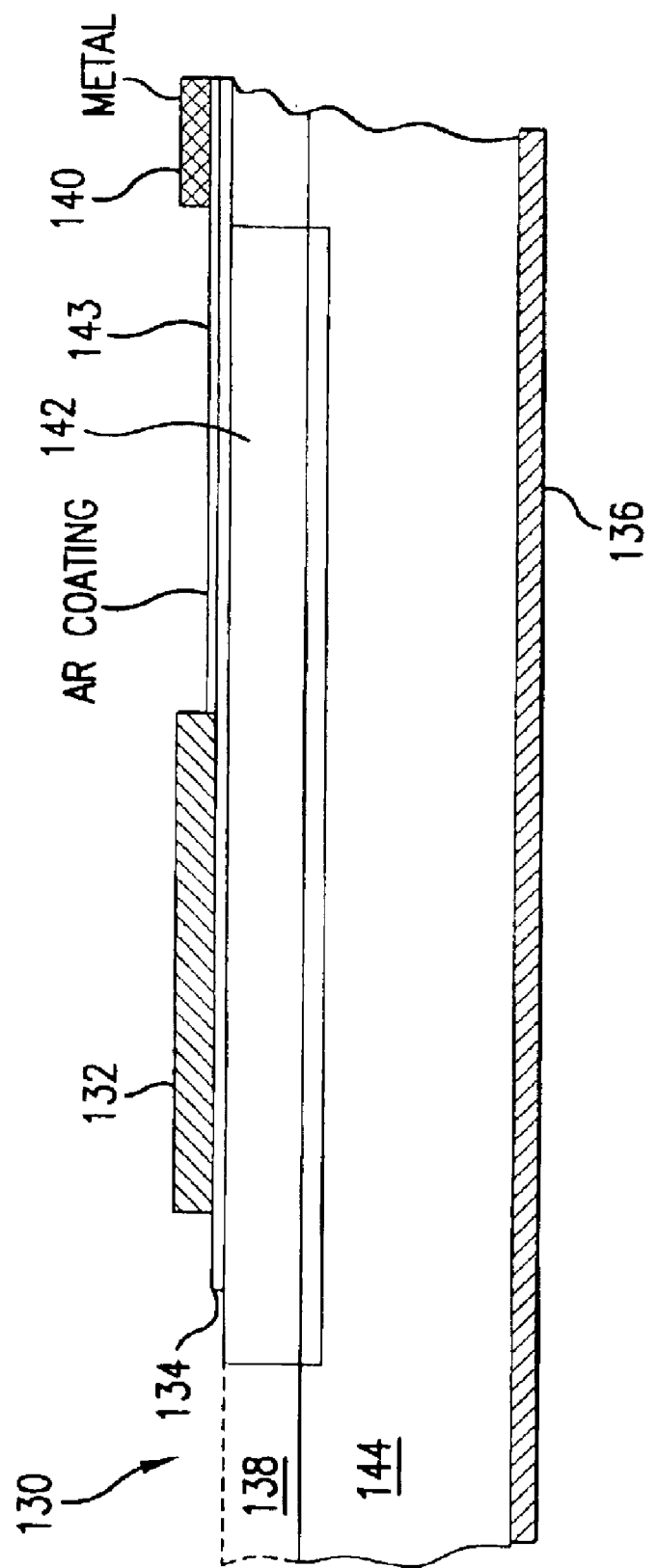
FIG. 4 is a block diagram illustrating an alternative epitaxial structure for a photodiode device, in accordance with preferred embodiments of the present invention.

FIG. 4 is a block diagram 130 illustrating an alternative epitaxial structure for a photodiode device, in accordance with preferred embodiments of the present invention. As indicated in FIG. 4, a metal layer 132 can be positioned above a cap 134 for ohmic contact. Note that cap 134 can be partially removed as part of an optional cap etch, at least over the active area. A P+ diffusion region 142 can extend through the N- cap 134, the upper N- confining layer 138 and into the top of the active region 144.

The n-upper confining layer 138 can act as a window for appropriate wavelengths because it can contain enough Al to increase the band gap, thereby causing little absorption. This upper confining layer can also be utilized to provide conduction, because it possesses heavy p-doping in the p-diffused region to reduce the R-C constant. This is important because photodiode response time is the root mean square sum of the charge collection time and the RC time constant arising from series plus load resistances and junction and stray capacitances. Cap 134 can be configured as a narrow band gap based on heavily doped material utilized for ohmic contact.

A metal layer 140 is also indicated in FIG. 4 above the lateral p-n junction to prevent light from entering this area and causing a slow response. Metal layer 140 can be insulated from the semiconductor by AR coating 143. P+ diffusion layer 142 can be formed by Be, Mg, or Zn implant or diffusion. Be implant and diffusion techniques are preferred in some instances. Those skilled in the art, however, can appreciate that other implant and diffusion techniques can be utilized in accordance with preferred embodiments of the present invention. An N- active region 144 is positioned below P+ diffusion layer 142. An N lower confining layer 136 is located below N- active region 144.

Figure 5:
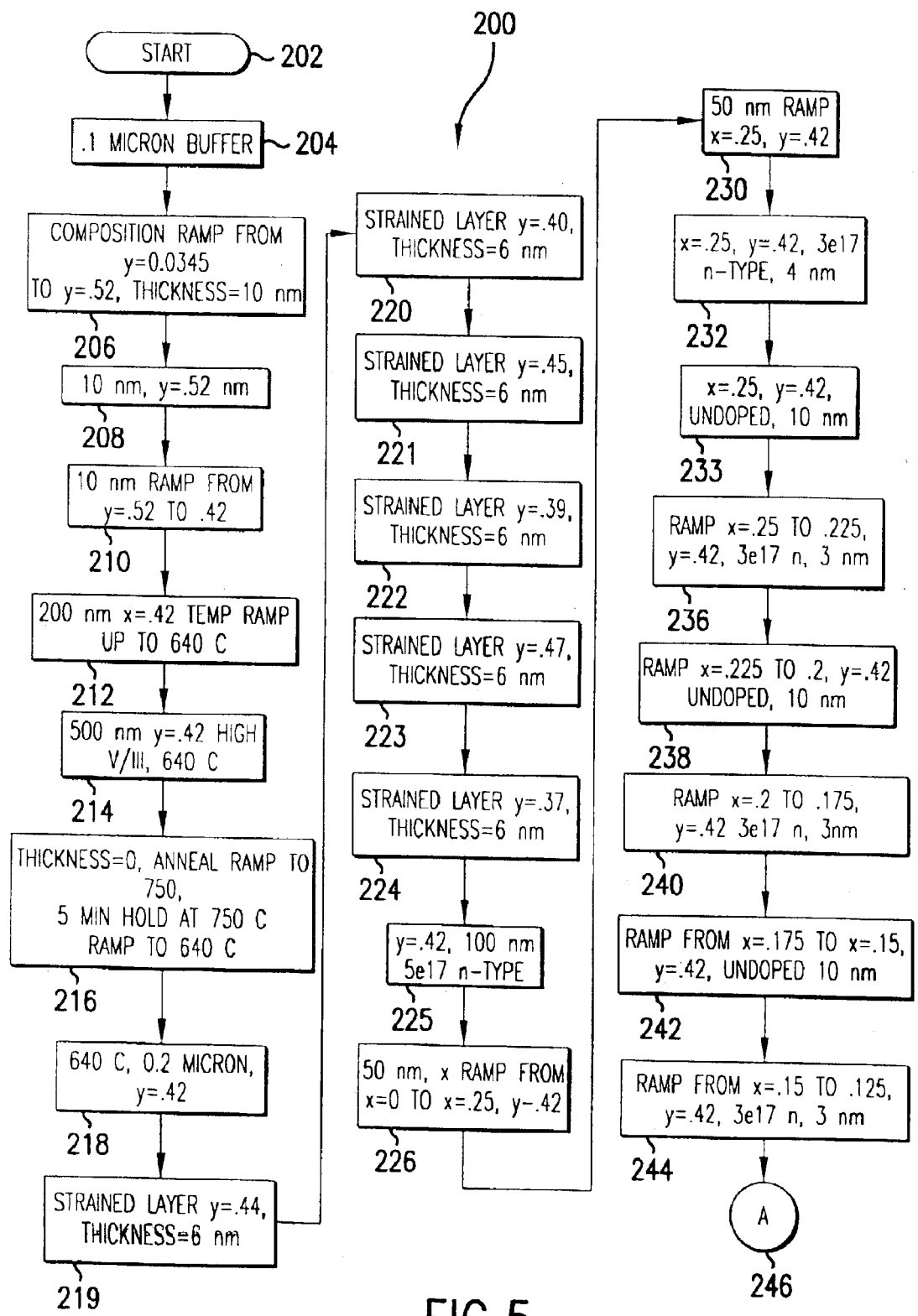
FIG. 5 depicts a flow chart of operations illustrating the epatixial process for forming a high-speed photodiode, in accordance with preferred embodiments of the present invention.
Figure 6:
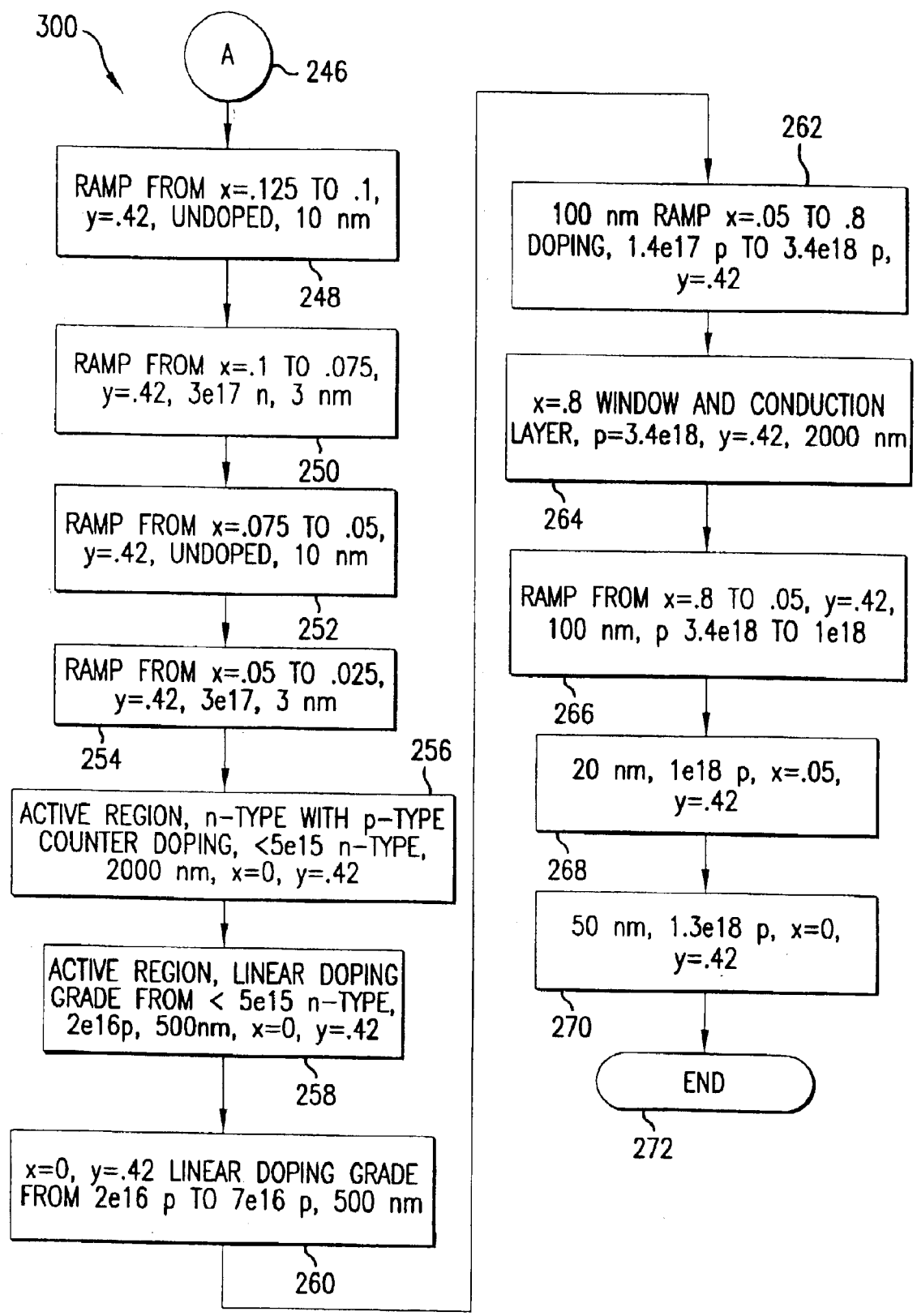
FIG. 6 illustrates a continued flow chart of operations illustrating the epatixial process for forming a high-speed photodiode, in accordance with preferred embodiments of the present invention.

FIG. 5 depicts a flow chart 200 of operations illustrating the epatixial process for forming a high-speed photodiode, in accordance with preferred embodiments of the present invention. Note that the flow chart 200 continues with flow chart 300 illustrated in FIG. 6. Flow chart 300 of FIG. 6 is a continuation of flow chart 200 of FIG. 5. The process is initiated, as illustrated at block 202. The values x and y described herein with respect to FIG. 5 are generally based on the following formulation:

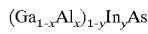

$(Ga_{1-x}Al_x)_{1-y}In_yAs$

Initially, as indicated at block 204, a 0.1 micron buffer layer which matches the substrate lattice constant can be grown at normal growth temperatures. As depicted thereafter at block 206, a composition ramp can be created from y=0.0345 to y=0.52, (for a 1300 nm detector) with a thickness of 10 nm. As described next at block 208, a 10 nm layer with y=0.52 can be grown.

As illustrated at block 210, a 10 nm ramp from y=0.52 to 0.42 can be grown. As indicated thereafter at block 212, a 200 nm layer can be formed, wherein y=0.42 with a temperature ramp up to 640 C. As depicted next at block 214, a layer 500 nm, with y=0.42, high V/III and 640 C temperature is formed. Then, as described at block 216, a layer with a thickness equivalent to 0 can be formed, based on an anneal, ramp up to 750 C, and a 5 minute hold at 750 C, and a temperature ramp back down to 640 C. The next layer formed, as illustrated at block 218, is based on a 640 C, 0.2 micron, y=0.42 layer.

Thereafter, as illustrated at block 219, a strained layer wherein y=0.44 is formed. This layer is about 6 nm thick. As indicated at block 220, a strained layer of y=0.40 is formed having a thickness of about 6 nm. Note that the strained layer formations illustrated with respect to blocks 219 to 220 occurs over approximately one hundred periods. A strained layer of y=0.45 with a thickness of 6 nm is formed, as illustrated at block 221. As indicated at block 222, a strained layer of y=0.39 with a thickness of above 6 nm is formed. Note that the strained layer formations illustrated with respect to blocks 221 to 222 occurs over approximately one hundred periods. Thereafter, as depicted at block 223, a strained layer of y=0.47 and a thickness of 6 nm is formed. Then, as described at block 224, a strained layer of y=0.37 and a thickness of 6 nm is formed. Note that the strained layer formations illustrated with respect to blocks 223 to 224 occur over approximately one hundred periods. Thereafter, as illustrated at block 225, a layer is formed in which y=0.42 with a thickness of 100 nm. As depicted at block 226, a layer of 50 nm can be formed from an x ramp value of x=0 to x=0.25 and a y value of 0.42.

The next step in the process, as depicted at block 230, involves the formation of a 50 nm layer with a composition of x=0.25 and y=0.42. This layer is more heavily doped (5e17) than layers formed thereafter so as to promote electrical conduction. Following the formation of this layer, as indicated at block 232, a layer can be formed in which x=0.25, and y=0.42. Note that this layer is approximately 4 nm thick with 3e17 n-type. As described next at block 233, a layer of x=0.25 and y=0.42 can be formed with an undoped thickness of 10 nm. Note that Debye length doping occurs over 80 periods through the steps indicated at blocks 232 and 233. Debye length doping is a method of controlling low doping which would be too low to actually intentionally dope otherwise. In Debye length doping, the doping is turned on periodically at a low level for only a short period of time. If the distance between these doped regions is less than the Debye length or the dopant diffusion length, then it is effectively doped over the whole region with the average doping. Such a step may be necessary to keep the diffusion of silicon to a minimum next to an active region. Thus, particular regions can be grown on the substrate utilizing Debye length doping.

As indicated thereafter at block 236, a ramp of x=0.25 to x=0.225 is formed. Also, in this step, y=0.42. The layer formed as a result of the step described at block 236 has a layer thickness of approximately 3 nm and is based on n-type doping 3e17 n. As indicated thereafter at block 238, ramping occurs from x=0.225 to 0.2 and y=0.42 undoped with thickness of 10 nm. As illustrated at block 240, ramping occurs from x=0.2 to x=0.175, while y=0.42. The resulting layer formed possesses a thickness of 3 nm and is based on n-doping of 3e17 n. As illustrated thereafter at block 242, ramping occurs in the formation of the next layer from x=0.175 to x=0.15 with y=0.42. The layer formed as a result of the operation described at block 242 has an undoped thickness of 10 nm. Then, as indicated at block 244, ramping occurs from x=0.15 to x=0.125 and y=0.42 to form a layer that is 3 nm thick and based on n-type doping of 3e17 n. The process continues, as indicated at connector block 246.

FIG. 6 is a continued flow chart 300 of operations illustrating the epatixial process for forming a high-speed photodiode, in accordance with preferred embodiments of the present invention. As illustrated at block 248, a layer is formed based on ramping from x=0.125 to x=0.1 and y=0.42. The layer formed as a result of the operation depicted at block 248 comprises an undoped layer that is 10 nm thick. As indicated next at block 250, ramping occurs from x=0.1 to x=0.075 and y=0.42 to form a layer based on n-type doping of 3e17 n, with a resulting thickness of 3 nm. Next, as illustrated at block 252, ramping occurs from 0.075 to x=0.05 and y=0.42 to form an undoped layer of 10 nm thickness. As depicted thereafter at block 254, a layer is formed based on ramping from x=0.05 to x=0.025, and y=0.42. The layer formed as a result of the operation illustrated at block 254 is approximately 3 nm thick and based on doping of 3e17. The blocks 236–254 represent a Debye length doped region with a ramp of composition.

The active region is then formed with n-type doping and p-type counter doping, with less than 5e15 n-type, as illustrated at block 256. As indicated previously, it is important that the lower portion of the active region be n-type for speed. P-type doping may also be present, however, as explained previously. Other characteristics formed during the step indicated at block 256 include a thickness of 2000 nm, n-type with p-type counter doping of 5e15 n and x=0 and y=0.42. As illustrated thereafter at block 258, the next active region layer undergoes linear doping from less than 5e15 n-type to 2e16 p-type, with a resulting thickness of 500 nm, again with x=0 and y=0.42. As indicated then at block 260, a linear p-doping grade from 2e16 p to 7e16 p occurs wherein x=0 and y=0.42, which results in a thickness of 500 nm. As described next at block 262, a 100 nm layer is formed with a composition ramp of x=0.05 to x=0.8 p-doping with a doping ramp of 1.4e17 p to 3.4e18 p and y=0.42.

As illustrated thereafter at block 264, a layer is formed wherein x=0.8 in a window and conduction layer. Also, in this step, p=3.4e18, y=0.42, and the thickness of the layer is 2000 nm. Thereafter, as illustrated in block 266, a layer with an Al composition ramp is formed wherein x=0.8 to 0.05, y=0.42, with a 100 nm thickness, and p-doping ramps from 3.4e18 to 1e18. Finally, a cap layer is formed, as illustrated at blocks 268 to 272. As illustrated at block, 268, a 20 nm layer is formed based on x=0.05, y=0.42 and p-doping of 1e18. As illustrated at block 270, a 50 nm layer is formed based on x=0, y=0.42 and p-doping of 1.3e18. The process then terminates, as indicated at block 272.

FIG. 7 depicts an exemplary structural diagram 320 illustrating the epitaxial process for forming a high-speed photodiode, in accordance with preferred embodiments of the present invention. The structure for forming a semiconductor device, such as a high-speed diode, according to the methods described herein, begins with a substrate 322. As explained previously, GaAs can preferably be utilized as the substrate material because it is less fragile and less expensive than other substrate materials, and additionally the use of GaAs does not require a phosphorous source. Other substrates can also be utilized in accordance with the present invention, germanium or silicon.

As illustrated in FIG. 7, at layer 324, a 0.1 micron buffer can be grown utilizing 1e18 n, while at layer 326, a layer is generally formed based on a composition ramp from y=0.0345 to y=0.52 with a thickness of 10 nm, based on 2.5e18 n doping. Layer 328 can be approximately 10 nm thick, wherein y=0.52 nm and doping of 2.5e18 n doping. Layer 330, situated above layer 328, can also be 10 nm thick and is based on a ramp from y=0.52 to 0.42. Additionally, layer 330 can be based on a doping of 2.5e18. Note that the units of doping referred to herein are generally in $cm^3$. Layer 332 is formed above layer 330 and is approximately 200 nm thick based on x=0.42 and a temperature ramp up to 640 C, along with a doping value of 2.5E18. Layer 334, which is situated above layer 332, is approximately 500 nm thick and is based on y=0.42 with a high V/III ratio and a formation temperature of 640 C.

Layer 336 has a layer thickness equivalent to 0 and is formed based on an annealing ramp up to 750 C, and a 5 minute hold at 750 C temperature and a ramp to 640 C. The next layer formed, layer 338, is based on a 640 C, 0.2 micron, y=0.42 layer. Layer 340 comprises a strained layer wherein y=0.44. Layer 340 also is a thickness of 6 nm. Layer 342 can also be formed as a strained layer with a 6 nm thickness and based on y=0.40. Note that the strained layers 340 to 342 can be formed over approximately one hundred periods and are designed to exclude dislocations. Layer 344 is formed as a strained layer of y=0.45 with a thickness of 6 nm. Similarly, layer 346 can be formed as a strained layer of y=0.39 with a thickness of 6 nm. Note that the strained layers 344 to 346 can be formed over approximately one hundred periods. Additionally, layer 348 is created as a strained layer of y=0.47 and a thickness of 6 nm. Finally, layer 350 is formed as a strained layer of y=0.37 and a thickness of 6 nm. Strained layers 340 to 342 can be formed over approximately one hundred periods.

Thereafter, layer 352 can be formed based on y=0.42 and a thickness of 100 nm. Additionally layer 352 is generally based on 5e17 n-type doping. Layer 354 is formed above layer 352 as a 50 nm thick layer based on an x ramp value of x=0 to x=0.25 and a y value of 0.42. Layer 354 is additionally formed based on 5e17 n-type doping. Layer 356, which is formed above layer 354, comprises a 50 nm thick layer based on a ramp of x=0.25 and y=0.42. Layer 356 comprises a layer that is 50 nm thick based on x=0.25 and y=0.42, and n-type doping of 5e17. Layer 358 is formed above layer 356 and is approximately 4 nm thick and based on 3e17 n-type doping. Additionally, layer 358 is formed based on x=0.25 and y=0.42.

Layer 360 comprises a layer 10 nm thick based on x=0.25 and y=0.42 and is undoped. Note that Debye length doping occurs over 80 periods for layers 358 and 360. As explained previously, Debye length doping is a technique method for controlling low doping, which would otherwise be too low to intentionally dope. In Debye doping, the doping is turned on at a low level for only a short period of time. If the distance between these doped regions is less than the Debye length or the diffusion length, then it is effectively doped over the entire region with the average doping.

Layer 362 can be formed based on a ramp of x=0.25 to x=0.225. Layer 362 also can be formed with a layer thickness of 3 nm and doping of 3e17 n. Layer 364 is formed based on ramping from x=0.225 to x=0.2 and y=0.42, with an undoped thickness of 10 nm. Layer 366 is formed based on ramping from x=0.2 to x=0.175, and y=0.42. The resulting layer formed has a thickness of 3 nm based on n-type doping of 3e17 n. In layer 368, ramping occurs from x=0.175 to x=0.15 and y=0.42 to form a layer with an undoped thickness of 10 nm. In layer 370, ramping occurs from x=0.15 to x=0.125 and y=0.42 to form a layer that is 3 nm thick, based on n-type doping of 3e17n. Likewise, ramping occurs for layer 372 from x=0.125 to x=0.1 and y=0.42 to form an undoped layer of 10 nm thickness. Layer 374 is formed based on ramping x=0.1 to x=0.075 and y=0.42. Layer 374 formed also has a thickness of 3 nm based on n-type doping of 3e17. Layer 376 is formed based on ramping from x=0.075 to x=0.05 and y=0.42. Layer 376 is an undoped layer 10 nm thick. Layer 378 can be formed based on ramping from x=0.05 to x=0.025 and y=0.42. The resulting layer (i.e., layer 378) that is formed is approximately 3 nm thick based on doping of 3e17.

An active region can be then formed with n-type doping and p-type counter doping, with less than 5e15 n-type net. Layer 380 comprises this portion of the active region. As indicated previously, it is important that the lower portion of the active region be n-type for speed. P-type doping can also be present, however, as explained previously. Other characteristics of layer 380 include a thickness of 2000 nm, based on x=0 and y=0.42. Layer 382 undergoes linear doping ramp from less than 5e15 N-type to 2e16 p with a resulting thickness of 500 nm with x=0 and y=0.42. Layer 382 forms an additional portion of the active region. Layer 384 comprises a portion of the active region based on a linear p-doping grade from 2e16 p to 7e16 p wherein x=0 and y=0.42. Layer 384 has a resulting thickness of 500 nm. Layer 386, which is formed above the active region, has a thickness of 100 nm based on x=0.05 to x=0.8 and y=0.42, and p-doping grade from 1.4e17 p to 3.4e18 p.

Layer 388 can be formed as a window and conduction layer based on x=0.8 and y=0.42. Layer 388 can also be formed based on p-type doping of 3.4e18, y=0.42. The resulting layer formed (i.e., layer 388) is approximately 2000 nm thick. Thereafter, layer 390 is formed based on a ramp of x=0.8 to x=0.05 and y=0.42. Layer 390 has a thickness of approximately 100 nm, and p-doping that occurs in the ramp from 3.4e18 to 1e18. Finally, a cap layer is formed, which is referenced as layers 392 and 394 in FIG. 7. Layer 392 comprises a 20 nm layer based on x=0.05, y=0.042 and p-doping of 1e18. Layer 394, formed above layer 392, has a thickness of approximately 50 nm and is formed based on x=0, y=0.42 and p-doping of 1.3e18. The grading layers 326 and 330 of FIG. 7 can be approximated by steps or a digital alloy as is commonly done using MBE.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is not intended to be exhaustive or to limit the scope of the invention. Many modifications and variations are possible in light of the above teaching without departing from the spirit and scope of the following claims. It is contemplated that the use of the present invention can involve components having different characteristics. It is intended that the scope of the present invention be defined by the claims appended hereto, giving full cognizance to equivalents in all respects.

The embodiments of an invention in which an exclusive property or right is claimed are defined as follows:

1. A metamorphic device formed upon a substrate, metamorphic device comprising:
    a substrate structure formed on a substrate, wherein the substrate structure ramps a lattice constant of the substrate to a desired lattice constant, said substrate structure comprising:
        at least one annealed grading layer that isolates dislocated regions within said at least one annealed grading layer; and
        a strained layer superlattice formed on said at least one annealed grading layer; and;
    a semiconductor device formed on the substrate structure.

2. The metamorphic device of claim 1, said at least one annealed grading layer having a first layer with an inverse grade, said first layer being formed on said substrate, said substrate having a (100) orientation.

3. The metamorphic device of claim 2, wherein said substrate comprises a GaAs substrate.

4. The metamorphic device of claim 2, wherein said substrate comprises a germanium substrate.

5. The metamorphic device of claim 2, wherein said substrate comprises a silicon substrate.

6. The metamorphic device of claim 1, wherein said semiconductor device comprises a photodiode.

7. The metamorphic device of claim 1, wherein:
    said at least one annealed grading layer includes a heavy n-type doping; and
    said at least one annealed grading layer includes a grading material including InGaAs to maintain conduction through the dislocated regions located within said at least one annealed grading layer.

8. The metamorphic device of claim 1, the substrate structure further comprising a buffer layer formed on said substrate to match a lattice constant of the substrate.

9. The metamorphic device of claim 1, the semiconductor device further comprising:
    a lower confining region formed on said strained layer superlattice;
    an active region formed above said lower confining region;
    an upper confining region formed above said active region;
    a cap formed above said upper confining region;
    a diffusion region formed in said cap and said upper confining region; and
    a metal layer formed on said cap.

10. The metamorphic device of claim 9, wherein said diffusion region comprises a P+ diffusion region.

11. The metamorphic device of claim 9, wherein said active region comprises:
    a partially n-active region; and
    a partially p-doped active region.

12. The metamorphic of claim 9, wherein said lower confining region comprises an N lower confining region.

13. The metamorphic device of claim 1, wherein said strained layer superlattice comprises:
    a lower strain region:
    a medium strain region; and
    a high strain region, such that none of the lower strain region, the medium strain region and the high strain region are so thick as to produce dislocations in the strained layer superlattice.

14. The metamorphic device of claim 9, where said cap is removed over a portion of said semiconductor device.

15. A metamorphic device grown on a substrate, the metamorphic device comprising:
    a substrate structure formed on the substrate, the substrate structure comprising:
        a buffer layer formed over the substrate, the buffer layer having a lattice constant that matches a lattice constant of the substrate;
        a first grading layer formed over the buffer layer, the first grading region ramping the lattice constant past a desired lattice constant;
        an intermediate layer formed over the first grading region;
        a second grading layer formed over the intermediate layer, the second grading region reversing the lattice constant back to the desired lattice constant; and
        a strained layer superlattice having one or more strained layers, each of the strained layers having a thickness less than a critical thickness; and
    a semiconductor device formed on the substrate structure.

16. A metamorphic device of claim 15, wherein the buffer layer, the first grading layer, the intermediate layer, and the second grading layer are annealed to isolate dislocated regions formed therein.

17. A metamorphic device of claim 15 wherein said substrate comprises a (100) nominally on orientation substrate.

18. A metamorphic device of claim 15 wherein said substrate comprises a GaAs substrate.

19. A metamorphic device of claim 15 wherein said semiconductor device comprises a long wavelength metamorphic photodiode is grown on said substrate structure, wherein one or more layers in the long wavelength metamorphic photodiode have Debye length doping.

20. A metamorphic device of claim 16 wherein said substrate comprises a GaAs substrate.

21. A metamorphic device of claim 20 wherein said substrate is a (100) nominally on orientation substrate.

22. A metamorphic device of claim 21 wherein said semiconductor device comprises a long wavelength metamorphic photodiode, wherein one or more layers of the long wavelength metamorphic photodiode have Debye doping.

23. A metamorphic device of claim 15, the semiconductor device having one or more layers with a graded aluminum composition.

24. A metamorphic device of claim 15, the semiconductor device further comprising:
a lower confining layer formed on the strained layer superlattice;
an active layer formed above the lower confining layer;
a conduction layer formed above the active layer; and
an upper confining layer.

25. In a system where a semiconductor device has a lattice constant that results in dislocations in the semiconductor device when formed on a particular substrate, a semiconductor structure grown on the substrate that enables the semiconductor device to be grown over the substrate, the semiconductor structure comprising:
a first graded layer formed over the substrate, the first graded layer ramping a lattice constant of the substrate past a desired lattice constant;
a second graded layer formed over the first graded layer, the second graded layer ramping the lattice constant back to the desired lattice constant, wherein at least the first graded layer and the second graded layer are annealed to isolate dislocated regions in at least the first graded layer and the second graded layer; and
a strained layer superlattice formed over the second graded layer, wherein the semiconductor device is formed over the strained layer superlattice.

26. The semiconductor structure of claim 25, further comprising:
a buffer layer formed between the first graded layer and the substrate, the buffer layer having a lattice constant that matches a lattice constant of the substrate;
an intermediate layer formed between the first graded layer and the second graded layer, the intermediate layer having a lattice constant that matches a lattice constant at an end point of the first grading layer; and
a third layer formed between the second graded layer and the strained layer superlattice, the third layer having a lattice constant that matches the desired lattice constant.

27. The semiconductor structure of claim 26, wherein:
the first graded layer is an annealed first layer;
the second graded layer is an annealed second layer;
the buffer layer is an annealed buffer layer;
the intermediate layer is an annealed intermediate layer; and
the third layer is an annealed third layer.

* * * * *